(12) United States Patent
Suyatin et al.

(10) Patent No.: US 12,456,622 B2
(45) Date of Patent: *Oct. 28, 2025

(54) FORMATION OF AN ARRAY OF NANOSTRUCTURES

(71) Applicant: AlixLabs AB, Lund (SE)

(72) Inventors: Dmitry Suyatin, Lund (SE); Amin Karimi, Lund (SE); Reza Jafari Jam, Lund (SE); Yoana Ilarionova, Lund (SE); Asif Muhammad, Lund (SE); Jonas Sundqvist, Lund (SE)

(73) Assignee: AlixLabs AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 19/191,370

(22) Filed: Apr. 28, 2025

(65) Prior Publication Data
US 2025/0259846 A1 Aug. 14, 2025

Related U.S. Application Data

(63) Continuation of application No. 18/957,406, filed on Nov. 22, 2024, which is a continuation of application No. PCT/EP2024/054786, filed on Feb. 26, 2024.

(30) Foreign Application Priority Data
Feb. 28, 2023 (EP) ...................... 23159155

(51) Int. Cl.
*H01L 21/033* (2006.01)
(52) U.S. Cl.
CPC ................. *H01L 21/0337* (2013.01)

(58) Field of Classification Search
CPC ............. H01L 21/0334; H01L 21/0337; H01L 21/0338
See application file for complete search history.

(56) References Cited

U.S. PATENT DOCUMENTS

| | | |
|---|---|---|
| 6,110,837 A | 8/2000 | Linliu et al. |
| 2007/0215960 A1 | 9/2007 | Zhu et al. |
| 2012/0052683 A1 | 3/2012 | Kim et al. |
| 2016/0093502 A1 | 3/2016 | Cheng et al. |
| 2016/0308020 A1 | 10/2016 | Sreenivasan et al. |

(Continued)

OTHER PUBLICATIONS

International Search Report and Written Opinion received in PCT Application No. PCT/EP2024/054786 as mailed Jun. 12, 2024 in 13 pages.

*Primary Examiner* — Walter H Swanson
(74) *Attorney, Agent, or Firm* — Knobbe, Martens, Olson & Bear, LLP

(57) ABSTRACT

A method for forming an array of nanostructures is presented. The method comprising: providing a layer structure including an array of first sacrificial nanostructures arranged on a supporting layer structure comprising at least a first material layer and a substrate; selectively applying spacer structures on sidewalls of the array of first sacrificial nanostructures; selectively etching away the array of first sacrificial nanostructures such that the spacer structures form an array of second sacrificial nanostructures; etching the first material layer using the array of second sacrificial nanostructures as an etching mask; and removing the array of second sacrificial nanostructures thereby exposing an array of nanostructures formed from the first material layer.

10 Claims, 7 Drawing Sheets

(56) References Cited

U.S. PATENT DOCUMENTS

| | | |
|---|---|---|
| 2018/0239244 A1* | 8/2018 | Raley .................. G03F 7/094 |
| 2019/0080918 A1 | 3/2019 | Khan et al. |
| 2021/0005456 A1 | 1/2021 | Sung et al. |
| 2025/0087487 A1 | 3/2025 | Suyatin et al. |

* cited by examiner

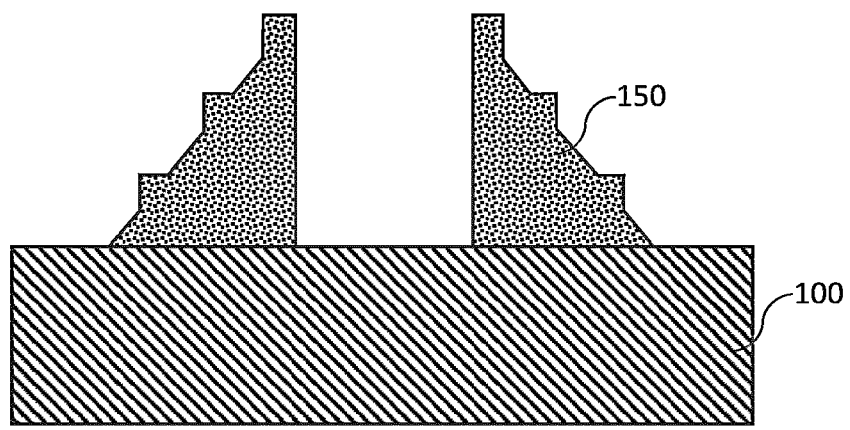
FIG. 7A
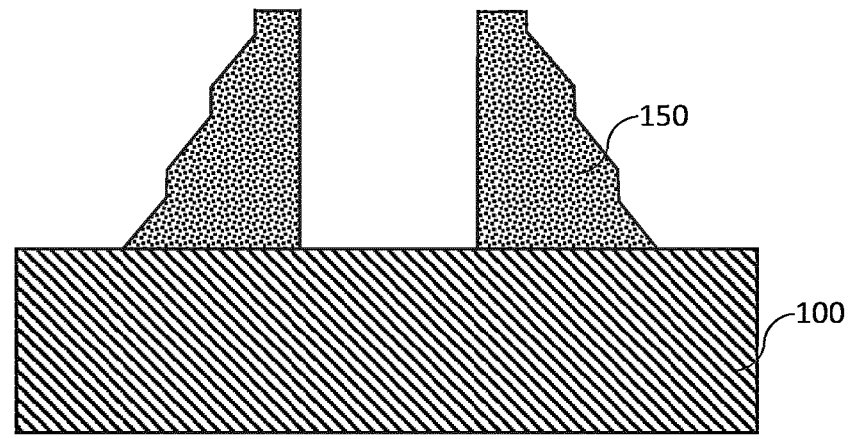
FIG. 7B
FIG. 7

FORMATION OF AN ARRAY OF NANOSTRUCTURES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present invention relates to formation of an array of nanostructures, the formation of the array of nanostructures being part of or constituting a self-aligned multiple patterning process.

Description of the Related Art

There is a limited supply of integrated circuits and a significant need to continue downscaling electronic components, such as transistors and memory chips. Development and downscaling of integrated circuits is very challenging. Production involves extreme costs, heavy load on the environment and heavy investments. Direct patterning, using e.g. optical lithography, is not always possible due to the extreme scaling of critical dimensions for modern electronic components. This is because the critical dimensions are much smaller than the wavelength of the light, which is used for optical lithography. Hence, light diffraction limits the direct patterning resolution.

Therefore, multiple patterning techniques have been introduced and are used currently as a complimentary technology to optical lithography. These patterning processes enable further scaling of critical dimensions towards smaller sizes. There is a plurality of different patterning techniques which are used today by industry to complement standard optical lithography. An example of an industrial multiple patterning method is called self-aligned multiple patterning, SAMP or SAxP, and includes self-aligned double patterning, SADP, self-aligned quadruple patterning, SAQP, and self-aligned octuple patterning, SAOP. Self-aligned multiple patterning processes enable sub-100 nm patterns manufacturing.

The self-aligned multiple patterning process flow is an indirect patterning method, and it is used in combination with direct patterning methods, usually with optical lithography in high volume manufacturing. Self-aligned multiple patterning is used as an extension for conventional direct patterning to produce ever-smaller patterns which cannot be created using available lithography. The self-aligned multiple patterning is used e.g. for such applications as formation of fins in field-effect transistors, FETs, shallow trench isolation, lines, and spaces for electrical interconnects, and bitline/wordline structures in memory devices. A very good process control is essential for self-aligned multiple patterning.

In self-aligned double patterning, spacer structures are formed on sidewalls of an original array of structures arranged on a substrate or material layer. The spacer structures are typically formed by deposition of a film on an existing pattern followed by etching to remove all the film material on the horizontal surfaces, leaving only the material on the sidewalls. Typically, the deposition of the film on an existing pattern and the etching to remove all the film material on the horizontal surfaces are made in different processing chambers which lead to high costs and technical difficulties in controlling the process results. Thereafter, by removing the original array of structures, only the spacer structures are left. There will be two spacer structures for each original structure, hence, the structure density has now doubled.

A known issue with the self-aligned double patterning is whether the spacer structures can stay in place after the material of the original array of structures is removed. Another issue is whether profiles of the spacer structures are acceptable. Yet another issue is whether the underlying material is attacked by the etch removing the material of the array of original structures. Further, pattern transfer is complicated by the situation where removal of the material of the array of original structures also removes a little of the underlying material or insufficiently removes underlying material in the corners. This may result in differences in topography of the layer directly below the spacer structures or adjacent to the spacer structure.

When self-aligned double patterning is repeated, an additional halving of the pitch is achieved. This is referred to as self-aligned quadruple patterning. Another repetition of this process leads to additional halving of the pitch. This is referred to as self-aligned octuple patterning. The number of this process repetition is typically limited to octuple patterning because of accumulated structure imperfections due to the above-described issues with the self-aligned double patterning.

In view of the above, there is room for improvement in the self-aligned multiple patterning process.

SUMMARY OF THE INVENTION

In view of the above, it is an object of the present invention to provide improvements in the self-aligned multiple patterning processes.

According to a first aspect a method for forming an array of nanostructures is provided. The method comprising: providing a layer structure including an array of first sacrificial nanostructures arranged on a supporting layer structure comprising at least a first material layer and a substrate; selectively applying spacer structures on sidewalls of the array of first sacrificial nanostructures; selectively etching away the array of first sacrificial nanostructures such that the spacer structures form an array of second sacrificial nanostructures; etching the first material layer using the array of second sacrificial nanostructures as an etching mask; and removing the array of second sacrificial nanostructures thereby. The method forming part of or constituting a self-aligned multiple patterning process.

In this context the phrase "nanostructure" is to be construed as a structure of intermediate size between micrometer scale structures and structures made of single atoms.

This method can be applied multiple times, in analogy with quadruple and octuple patterning, in this way further increasing the resulting array density and ultimately arrays of structures made of single atoms can be formed by this method by repeating it sufficient number of times. This makes it possible to form nanostructures with very small dimensions, preferably below 20 nm, even more preferably, below 10 nm, by using relatively large starting nanostructures, typically in the range between 1000 nm and 10 nm.

By the present method improved process control may be achieved due to the selective application of spacer structures on sidewalls of the array of first sacrificial nanostructures.

The selective application of spacer structures on the sidewalls of the array of first sacrificial nanostructures allows performing the self-aligned multiple patterning process in a single processing chamber and multiple times, that is all the process steps may be made without relocating the layer structure in between different process steps. Further, the selective application of spacer structures provides reduced strain on the nanostructures. This in turn provides for a more uniform array of "resulting" nanostructures formed from the self-aligned multiple patterning process. Nanostructures with less defects may also be provided. Accordingly, effects in self-aligned multiple patterning processes referred to as footing, shrinkage, bird's beak, tilting kinking and asymmetric gouging of the formed nanostructures may be reduced or even avoided.

Selectively applying spacer structures on sidewalls of the array of first sacrificial nanostructures comprises a cyclic modification process. Each cycle in the cyclic modification process comprises: i) isotropic modification of exposed surfaces of the array of first sacrificial nanostructures and of the first material layer, and ii) anisotropic etching of modified material from top surfaces of the first material layer and the first sacrificial nanostructures. The cyclic modification process provided for forming the spacer structures on sidewalls of the array of first sacrificial nanostructures.

The isotropic modification may comprise one or more of deposition, adsorption, conversion and extraction.

The anisotropic etching may comprise dry etching.

In each cycle of the cyclic modification process the anisotropic etching may follow directly after the isotropic surface modification.

The method may further comprise, during the cyclic modification process, anisotropic etching away material from top surfaces of the first material layer thereby forming an inclination in surfaces forming borders between the spacer structures and the first material layer.

The method may further comprise, in between selectively applying spacer structures on sidewalls of the array of first sacrificial nanostructures and selectively etching away the array of first sacrificial nanostructures: etching away a sublayer of the first material layer using the first sacrificial nanostructures and the spacer structures on the sidewalls of the first material layer as an etching mask; and selectively applying additional spacer structures on sidewalls of the spacer structures and on the sidewalls of the first material layer exposed by etching away the sublayer of the first material layer. Selectively applying additional spacer structures may be made by the cyclic modification process discussed above.

The method may further comprise subjecting the array of nanostructures formed from the first material layer to a cyclic etch process where each cycle comprises subjecting the array of nanostructures for surface modification by one or more of chemisorption, deposition, conversion and extraction and subjecting the array of nanostructures for a particle beam consisting of particles having an energy of less than 10000 eV, preferably less than 1000 eV, more preferably less than 100 eV wherein the particle beam having a direction being parallel with a surface normal to the substrate within a deviation of ±20°, whereby selective etching of main surfaces of the array of nanostructures relative to walls of the array of nanostructures is achieved such that a recess is formed in each of the nanostructures in the array of nanostructures.

In addition, the method may comprise a combination of isotropic surface modification and anisotropic selective material removal from horizontal surfaces in the same process step or in two adjacent and overlapping steps.

All the steps of the method may be performed in a same processing chamber. Accordingly, reduced process time and reduced process cost may be achieved in this way enabling sustainable and economical scaling of electronic and optical devices.

The spacer structures may be made from a hardmask, such as carbon, TiN, silicon, silicon-germanium alloy, nitride, oxide, for instance hafnium oxide, silicon oxide, aluminum oxide and a polymer, such as a fluorocarbon polymer.

The first sacrificial nanostructures may be made from a mandrel material, such as an optical resist material, resist for extreme ultraviolet lithography (EUV), electron beam sensitive resist, nanoimprint resist or other polymer, carbon, amorphous carbon, crystalline silicon, amorphous silicon, polycrystalline silicon, nitride, oxide, or other semiconductor material, such as group III-V or II-VI semiconductors, alternatively, or metal. These are just examples of different materials which can be used to form the mandrel.

The substrate may be made from insulator material, such as an oxide.

A further scope of applicability will become apparent from the detailed description given below. However, it should be understood that the detailed description and specific examples are given by way of illustration only.

It is to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above and other aspects will now be described in more detail, with reference to appended figures. The figures should not be considered limiting; instead, they are used for explaining and understanding.

As illustrated in the figures, the sizes of layers and regions may be exaggerated for illustrative purposes and, thus, are provided to illustrate the general structures. Like reference numerals refer to like elements throughout.

FIGS. 7A and 7B illustrate examples of patterned surfaces of nanostructures that may be formed using the process disclosed in this disclosure.

DETAILED DESCRIPTION OF THE PREFERRED EMBODIMENT

The present invention will now be described more fully hereinafter with reference to the accompanying drawings, in which currently preferred embodiments of the invention are shown. This invention may, however, be embodied in many different forms.

The present disclosure is directed towards improvements in self-aligned multiple patterning. Improvements of at least two different aspects of the self-aligned multiple patterning process are considered. Both improvements in formation of spacer structures on sidewalls of an array of "starting" nanostructures and patterning of an array of "resulting" nanostructures formed from the self-aligned multiple patterning process will be discussed.

Figure 1:
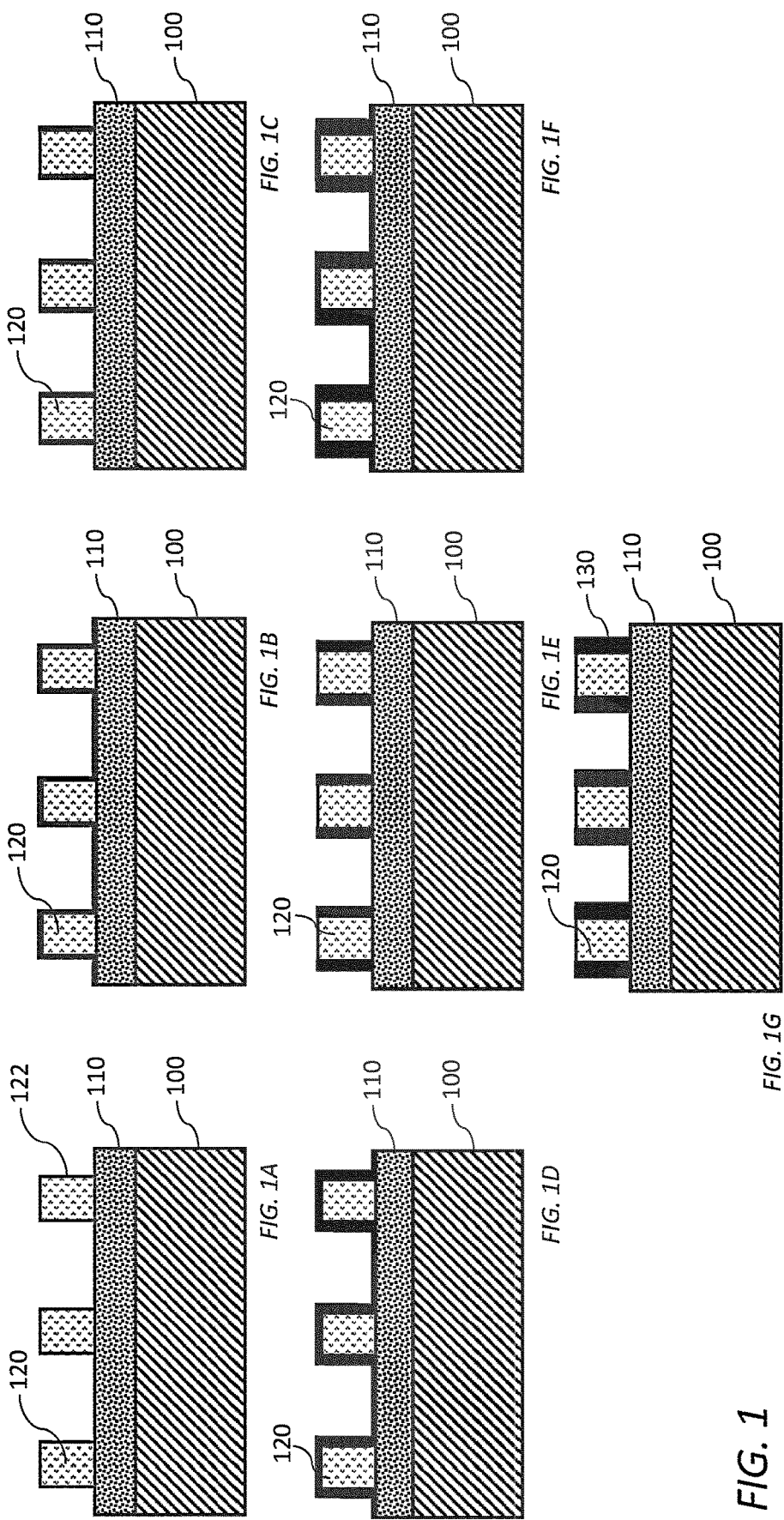
FIG. 1, comprising FIGS. 1A-1G, schematically illustrates formation of spacer structures on sidewalls of an array of nanostructures using a cyclic modification process.

Formation of spacer structures on sidewalls of an array of "starting" nanostructures will be discussed in connection with FIG. 1 comprising FIGS. 1A-1G. In FIG. 1A a starting layer structure comprising a starting pattern for a self-aligned multiple patterning process is schematically illustrated. The starting layer structure comprises a substrate 100 with an array of first sacrificial nanostructures 120 arranged thereon and a first material layer 110 arranged between the substrate 100 and the array of first sacrificial nanostructures 120. It is realized that the starting layer structure may comprise additional layers as long as the topmost layer is the array of first sacrificial nanostructures 120. The array of first sacrificial nanostructures 120 represents the starting pattern. The array of first sacrificial nanostructures 120 may, e.g., be formed by optical lithography. A width of the first sacrificial nanostructures 120 is typically in the range of 3-100 nm. A height of the first sacrificial nanostructures 120 is typically in the range of 3-200 nm. A pitch of the array of the first sacrificial nanostructures 120 is typically in the range of 10-200 nm.

The substrate 100 may be formed from an oxide, nitride, crystalline silicon, amorphous silicon, polycrystalline silicon, or other semiconductor material, such as group III-V or II-VI semiconductors, alternatively, metal or a polymer.

The first material layer 110 may be a hardmask or such materials as crystalline silicon, amorphous silicon, polycrystalline silicon, nitride, oxide, or other semiconductor material, such as group III-V or II-VI semiconductors, alternatively, metal or a polymer.

The first sacrificial nanostructures 120 may be formed from a mandrel material, such as an optical resist, resist for extreme ultraviolet lithography, electron beam sensitive resist, nanoimprint resist or other polymer, carbon, amorphous carbon, crystalline silicon, amorphous silicon, polycrystalline silicon, nitride, oxide, or other semiconductor material, such as group III-V or II-VI semiconductors, alternatively, or metal.

Selectively applying spacer structures on sidewalls of the array of first sacrificial nanostructures may at least partly be enabled by surface-controlled reactions, such as adsorption, conversion, and extraction. Specifically, surface limited adsorption reaction is important for atomic layer deposition, molecular layer deposition, atomic layer etching, and their combination. Adsorption can be made by chemisorption, physisorption, diffusion, ion implantation and combinations thereof. Conversion can be done by oxidation, nitridation, densification, crystallization, and their combination. In the extraction case, one specific element is selectively removed in compound material in the top material layer, in this way modifying the topmost surface. Extraction can be also achieved by oxidation. It is realized that these surface limited reactions do not need to be ideal, some additional and quasi-surface limited processes can happen at the same time. Accordingly, effects in self-aligned multiple patterning processes referred to as process uniformity across production wafers and pitch walking known as pitch variation in between different features which cause inconsistency in critical dimensions of different features originating from process variations across the production wafers may be reduced or even avoided.

Selectively applying the spacer structure on the sidewalls of the array of first sacrificial nanostructure may at least partially be enabled by anisotropically and selectively removing the material resulted on horizontal surfaces from the isotropic surface-controlled reactions. This may be achieved by using gentle activation of the modified surface in such way that the material which is left on the surface stays damage free. This anisotropic removal may be achieved, for example, by a particle beam consisting of particles having an energy of less than 10000 eV, preferably less than 1000 eV, more preferably less than 100 eV, wherein the particle beam having a direction being parallel with a surface normal to the substrate within a deviation of ±20°, whereby selective etching of main surfaces of the array of nanostructures relative to walls of the array of nanostructures is achieved. Accordingly, final structures with reduced damage or ultimately completely damage free may be achieved in this way enabling repetition of this process more than three times and creating nanostructures which can be directly used as active structures in electronic and optical devices.

As now will be discussed in connection with FIGS. 1B-1G, the formation of spacer structures 130 on sidewalls 122 of the array of first sacrificial nanostructures 120 is made by selectively applying the spacer structures 130 on the sidewalls 122 of the first sacrificial nanostructures 120. The process of selectively applying the spacer structures 130 on the sidewalls 122 may comprise a cyclic modification process. FIGS. 1B and 1C schematically illustrate a first cycle in the cyclic modification process, FIGS. 1D and 1E schematically illustrate a second cycle in the cyclic modification process, and FIGS. 1F and 1G schematically illustrate a third cycle in the cyclic modification process. Hence, the cyclic modification process comprises a plurality of cycles. It is understood that the cyclic modification process may comprise more than the three cycles illustrated in connection with FIG. 1.

The spacer structure 130 on sidewall 122 may be a hardmask or a semiconductor material, metal, a polymer, such as a fluorocarbon polymer. A width of the spacer structure 130 is typically in the range of 3-100 nm. A height of the spacer structure is typically similar to the height of the first sacrificial nanostructure 120.

Each cycle in the cyclic modification process comprises i) isotropic modification of exposed surfaces of the array of first sacrificial nanostructures 120 and exposed surfaces of the first material layer 110, and ii) anisotropic etching of modified material from top surfaces of the first sacrificial nanostructures 120 and from top surfaces of the first material layer 110. The top surfaces may also be referred to as horizontal surfaces of the first sacrificial nanostructures 120 and the first material layer 110, respectively. In FIGS. 1B-1G this is illustrated as first performing an isotropic modification of exposed surfaces of the array of first sacrificial nanostructures 120 and exposed surfaces of the first material layer 110, see FIGS. 1B, 1D and 1F and after each such isotropic modification performing anisotropic etching of modified material from top surfaces of the first sacrificial nanostructures 120 and from top surfaces of the first material layer 110, see FIGS. 1C, 1E and 1G. Hence, in each cycle the spacer structures on sidewalls 122 of the array of first sacrificial nanostructures 120 are gradually formed. This is schematically seen in FIGS. 1C, 1E and 1G by that the structures on the sidewalls 122 of the array of first sacrificial nanostructures 120 are gradually becoming thicker. After the last cycle in the cyclic modification process the spacer structures 130 are formed, see FIG. 1G.

In connection with the schematic illustration presented in FIGS. 1B-1G the cyclic modification process is illustrated as having three cycles. It is to be realized that the schematic illustration presented in FIGS. 1B-1G is just a schematic illustration made in order to give an understanding of the process. In practice, the number of cycles in the cyclic modification process may be in the range of two and one thousand, preferably between three and fifty. The number of cycles may vary depending on a desired width of the spacer structures 130. The number of cycles may vary depending on which process is used for the isotropic modification of exposed surfaces of the array of first sacrificial nanostructures 120 and of the first material layer 110. The number of cycles may also vary depending on material used for the sacrificial nanostructure 120.

The isotropic modification may be seen as a surface modification process. Hence, all surfaces exposed to the isotropic modification are subjected to surface modification. The isotropic modification may comprise one or more of deposition, adsorption, conversion and extraction. Specifically, deposition can be by sputtering, epitaxy, evaporation, chemical vapor deposition, atomic layer deposition, molecular layer deposition and their combination. Adsorption can be by chemisorption, physisorption, diffusion, ion implantation and combination of thereof. Conversion can be done by oxidation, nitridation, densification, crystallization, and their combination. In the extraction case, one specific element is selectively removed in compound material in the top material layer, in this way modifying the topmost surface. Extraction can be also achieved by oxidation. The deposition may be made by an atomic layer deposition process, such as plasma enhanced atomic layer deposition and thermal atomic layer deposition. It is realized that the atomic layer deposition does not need to be ideal, a quasi-atomic layer deposition process may be used.

The anisotropic etching comprises dry etching. Suitable dry etching methods are continuous etching methods or cyclic etching methods. Examples of continuous etching methods are low energy particle beam sputtering, for example with Ar ions, and low energy particle beam continuous reactive ion etching, for example with Ar and $Cl_2$ gases. Examples of cyclic etching methods are atomic layer etching and quasi-atomic layer etching. Here quasi-atomic layer etching refers to different processes with process parameters similar to those of ideal atomic layer etching but somewhat different, e.g. outside of saturation regions, which could mean non-self-limiting process behavior. The quasi-atomic layer etching may provide a faster etch process at the expense of process stability and may be preferred in some cases.

Preferably, in each cycle of the cyclic modification process the anisotropic etching follows directly after the isotropic surface modification. Doing so, formation of continuous film on top surfaces of the first sacrificial nanostructures 120 and on top surfaces of the first material layer 110 can be avoided. This is since the etching is performed before any film is even nucleated on said top surfaces. This will also provide avoidance of strain formation in the layer applied by the surface modification.

The cyclic modification process may comprise additional steps, such as a pump step, a purge step and their combination, overlaps and repetition. The pump step meaning that all process gases and the reaction products and byproducts being pumped away from the process chamber in such way that a low pressure of at least 10E-3 Torr is achieved, preferably below 10E-5 Torr. Purge step meaning that an inert gas is pumped through the chamber at a high pressure, typically in the range 1000-0.001 Torr, preferably in the range 1 Torr-10 mTorr.

After formation of the spacer structures 130 on sidewalls 122 of the array of first sacrificial nanostructures 120 is made the self-aligned multiple patterning process may continue by selectively etching away the array of first sacrificial nanostructures 120, preferably dry etching, such that the spacer structures 130 form an array of second sacrificial nanostructures 140. This is schematically illustrated in connection with FIGS. 2A and 2B, i.e. the selectively etching away of the array of first sacrificial nanostructures 120 starts at the layer structure illustrated in FIG. 2A (being the same layer structure as in FIG. 1F) and ends at the layer structure illustrated in FIG. 2B. For some applications the self-aligned multiple patterning process may stop at this step. The array of second sacrificial nanostructures 140 may in such applications not be sacrificial nanostructures but may constitute an array of nanostructures used in various applications, such as transistor channels, electrical interconnects, optical elements, for instance, optical gratings, photonic crystals, optical waveguides.

For some applications, the self-aligned multiple patterning process may continue by anisotropic etching the first material layer 110 using the array of second sacrificial nanostructures 140 as an etching mask. This is illustrated in connection with FIGS. 2B and 2C, i.e. the etching of the first material layer 110 starts at the layer structure illustrated in FIG. 2B and ends at the layer structure illustrated in FIG. 2C. The etching may be performed so that the first material layer is etched fully through exposing the underlying layer, in this case the substrate 100.

The self-aligned multiple patterning process may continue by selectively removing the array of second sacrificial nanostructures 140, preferably using dry etching. This is illustrated in connection with FIGS. 2C and 2D, i.e. the removal of the array of second sacrificial nanostructures 140 starts at the layer structure illustrated in FIG. 2C and ends at the layer structure illustrated in FIG. 2D. By this process step an array of nanostructures 150 formed from the first material layer are exposed.

Figure 3:
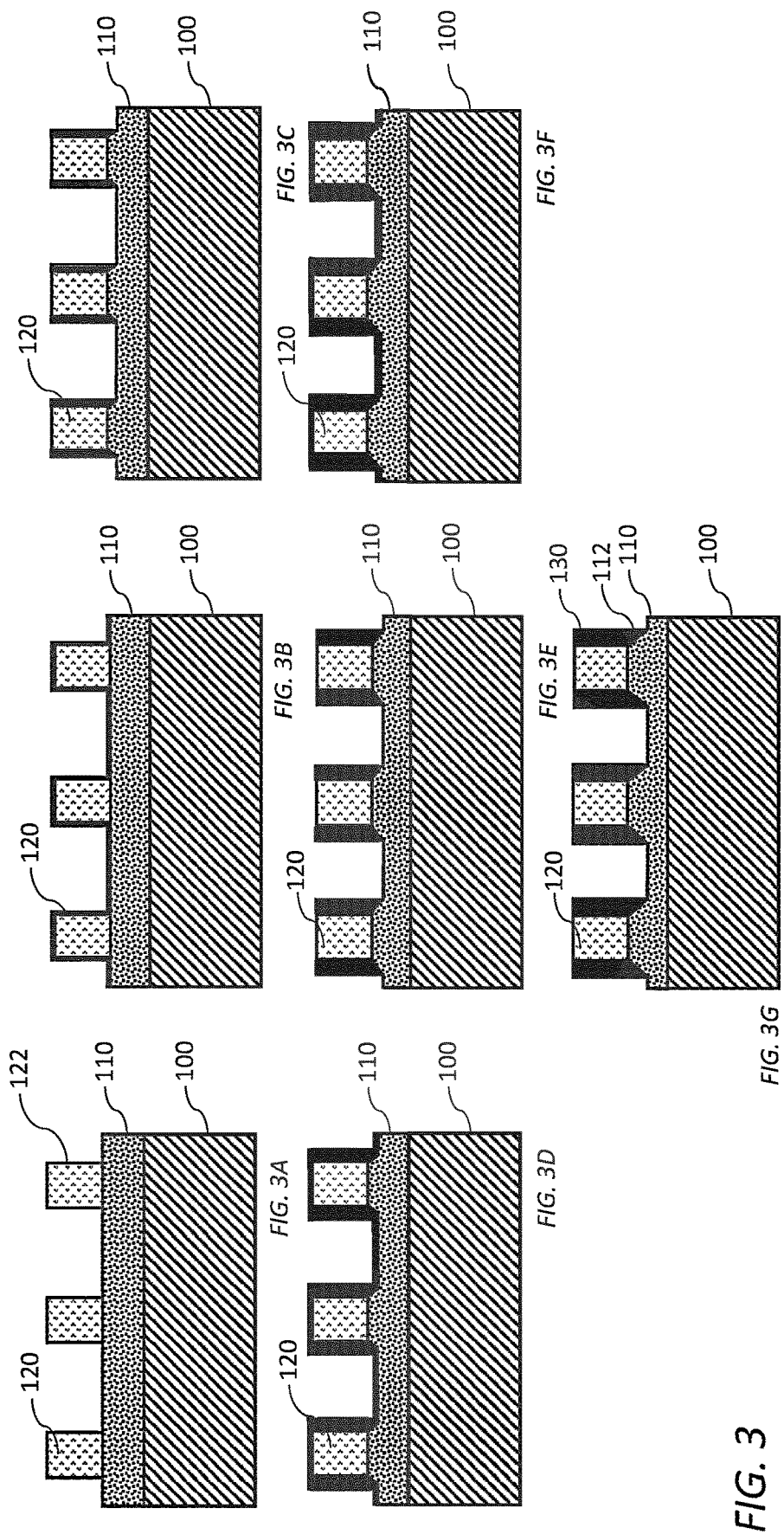
FIG. 3, comprising FIGS. 3A-3G, schematically illustrates an alternative process of formation of spacer structures on sidewalls of an array of nanostructures using a cyclic modification process.

As will be discussed in connection with FIG. 3 comprising FIGS. 3A-3G, during the cyclic modification process, anisotropic etching away of material from top surfaces of the first material layer 110 may be performed. By such etching away of material from top surfaces of the first material layer 110 an inclination 112 in surfaces forming borders between the spacer structures 130 and the first material layer 110 may be formed. The inclination being inclined surface of material layer 110 delimiting flat surfaces of material layer 100. The inclination angle being in the range between 0 and 90 degrees to the original surface, preferably between 30 and 80 degrees. The inclination 112 width typically in the range 3-100 nm and the inclination 112 height typically in the range 3-200 nm. The etching away material from top surfaces of the first material layer 110 may be performed during one or more of the cycles of the cyclic modification process. Hence, etching away material from top surfaces of the first material layer 110 may be performed during a sub-portion of the cycles of the cyclic modification process. Alternatively, etching away material from top surfaces of the first material layer 110 may be performed during each of the cycles of the cyclic modification process. Preferably, the etching away material from top surfaces of the first material layer 110 is performed during the isotropic etching in the cycles of the cyclic modification process. In FIGS. 3A-3G the anisotropic etching away of material from top surfaces of the first material layer 110 is schematically illustrated. In this schematic illustration, anisotropic etching away of material from top surfaces of the first material layer 110 is performed in each cycle of the cyclic modification process, however, as mentioned above this is not always the case, the etching away of material from top surfaces of the first material layer 110 may be performed in just some of the cycles. Just as for the process described in connection with FIG. 1 an isotropic modification of exposed surfaces of the array of first sacrificial nanostructures 120 and exposed surfaces of the first material layer 110, see FIGS. 3B, 3D and 3F, is first made in each cycle of the cyclic modification process. However, in addition to anisotropic etching of modified material from top surfaces of the first sacrificial nanostructures 120 and from top surfaces of the first material layer 110, also a top layer of the exposed top surfaces of the first material layer 110 are etched away in connection with the anisotropic etching, see FIGS. 3C, 3E and 3G. Hence, inclinations in surfaces forming borders between the spacer structures 130 and the first material layer 110 are formed during the cyclic modification process due to the etching away of material from top surfaces of the first material layer 110 at the same time as the gradual formation of the spacer structures 130 on sidewalls 122 of the array of first sacrificial nanostructures 120. After the last cycle in the cyclic modification process the spacer structures 130 are formed, see FIG. 3G, however, these spacer structures 130 have inclinations 112 in surfaces forming borders between the spacer structures 130 and the first material layer 110.

As will be discussed in connection with FIG. 4, comprising FIGS. 4A-4D, after formation of the spacer structures 130 on sidewalls 122 of the array of first sacrificial nanostructures 120 is made the self-aligned multiple patterning process may continue by selectively etching away the array of first sacrificial nanostructures 120 such that the spacer structures 130 form an array of second sacrificial nanostructures 140. The selectively etching away of the array of first sacrificial nanostructures 120 is schematically illustrated in connection with FIGS. 4A and 4B, i.e. the selectively etching away the array of first sacrificial nanostructures 120 starts at the layer structure illustrated in FIG. 4A (being the same layer structure as in FIG. 3F) and ends at the layer structure illustrated in FIG. 4B. The selectively etching away of the array of first sacrificial nanostructures 120 is preferably made in a same manner as discussed above in connection with FIG. 2. In order to avoid undue repletion reference is made to the above discussion. The self-aligned multiple patterning process may continue by etching the first material layer 110 using the array of second sacrificial nanostructures 140 as an etching mask. This is illustrated in connection with FIGS. 4B and 4C, i.e. the etching of the first material layer 110 starts at the layer structure illustrated in FIG. 4B and ends at the layer structure illustrated in FIG. 4C. The etching of the first material layer 110 is discussed in more detail in connection with the discussion of FIG. 2 above and will not be repeated here. The etching may be performed so that the first material layer is etched fully through exposing the underlying layer, in this case the substrate 100. The self-aligned multiple patterning process may continue by removing the array of second sacrificial nanostructures 140. The removal of the array of second sacrificial nanostructures 140 is illustrated in connection with FIGS. 4C and 4D, i.e. the removal of the array of second sacrificial nanostructures 140 starts at the layer structure illustrated in FIG. 4C and ends at the layer structure illustrated in FIG. 4D. The removal of the array of second sacrificial nanostructures 140 is discussed in more detail in connection with the discussion of FIG. 2 above and will not be repeated here. By this process an array of nanostructures 150 formed from the first material layer are exposed. The top surfaces of such formed nanostructures 150 are inclined due to the anisotropic etching away material from top surfaces of the first material layer 110 discussed in connection with FIG. 3. This is one type of patterning of the array of "resulting" nanostructures formed from the self-aligned multiple patterning process. That is, inclinations of the top surface of the array of "resulting" nanostructures may be formed.

In connection with FIG. 5, especially in connection with FIGS. 5A-5G of FIG. 5, an alternative in patterning of the array of "resulting" nanostructures formed from the self-aligned multiple patterning process will now be discussed. This alternative in patterning of the array of "resulting" nanostructures formed from the self-aligned multiple patterning process is aiming at forming a stepped top surface of the nanostructures of the array. A similar layer structure as discussed in connection with FIG. 1A is used as a starting structure. The starting structure is illustrated in FIG. 5A. It is, however, realized that different starting layer structures may be used as long as the topmost layer in the layer structure is an array of first sacrificial nanostructures 120. Next, spacer structures 130 on sidewalls of the array of first sacrificial nanostructures 120 are formed in accordance with the process of selective application of spacer structures 130 on sidewalls of the array of first sacrificial nanostructures 120 discussed above in connection with FIGS. 1B-1G. A resulting layer structure is illustrated in FIG. 5B. Note that the layer structure of FIG. 5B is similar to the layer structure of FIG. 1G. As a next step in the self-aligned multiple patterning process a sublayer of the first material layer 110 is etched away using the first sacrificial nanostructures 120 and the spacer structures 130 and on the sidewalls 122 of the first material layer 110 as an etching mask. The result from such etching away of a sublayer of the first material layer 110 is schematically illustrated in FIG. 5C. Thereafter, additional spacer structures 132 are selectively applied on sidewalls of the spacer structures 130 and on the sidewalls of the first material layer 110 exposed by the etching away of the sublayer of the first material layer 110. This additional spacer structure 132 is typically made of the same material as the spacer structure 130. However, a different material then material of spacer structure 130 may be used. A width of this additional spacer structure 132 is typically in the range of 3-100 nm. A height of this additional spacer structure 132 is typically in the range 3-200 nm. The result from such etching away of a sublayer of the first material layer 110 is schematically illustrated in FIG. 5D. The selective application of the additional spacer structures 132 is preferably made by a cyclic modification process as discussed in connection with FIG. 1 above. In order to avoid undue repetition, reference is made to the above discussion for providing a way of how to selectively apply the additional spacer structures 132. The spacer structures 130 and the additional spacer structures 132 together form stepped spacer structures 134. The process may continue with formation of one or more additional steps in the stepped spacer structures 134 by repeating the etching away of a further sublayer of the first material layer 110 and selective applying of yet additional spacer structures.

After formation of the stepped spacer structures 134 the self-aligned multiple patterning process may continue by selectively etching away the array of first sacrificial nanostructures 120 such that the stepped spacer structures 134 form an array of second sacrificial nanostructures 140. The second sacrificial nanostructures 140 being composed of the same or modified material as the stepped spacer structures 134 and having the same or similar dimensions as the stepped spacer structures 134. The selectively etching away of the array of first sacrificial nanostructures 120 is schematically illustrated in connection with FIGS. 5D and 5E, i.e. the selectively etching away of the array of first sacrificial nanostructures 120 starts at the layer structure illustrated in FIG. 5D and ends at the layer structure illustrated in FIG. 5E. The selectively etching away of the array of first sacrificial nanostructures 120 is preferably made in a same manner as discussed above in connection with FIG. 2. In order to avoid undue repletion reference is made to the above discussion.

The self-aligned multiple patterning process may continue by etching the first material layer 110 using the array of second sacrificial nanostructures 140 as an etching mask. This is illustrated in connection with FIGS. 5E and 5F, i.e. the etching of the first material layer 110 starts at the layer structure illustrated in FIG. 5E and ends at the layer structure illustrated in FIG. 5F. The etching of the first material layer 110 is discussed in more detail in connection with the discussion of FIG. 2 above and will not be repeated here. The etching may be performed so that the first material layer is etched fully through exposing the underlying layer, in this case the substrate 100.

The self-aligned multiple patterning process may continue by removing the array of second sacrificial nanostructures 140. The removal of the array of second sacrificial nanostructures 140 is illustrated in connection with FIGS. 5F and 5G, i.e. the removal of the array of second sacrificial nanostructures 140 starts at the layer structure illustrated in FIG. 5F and ends at the layer structure illustrated in FIG. 5G. The removal of the array of second sacrificial nanostructures 140 is discussed in more detail in connection with the discussion of FIG. 2 above and will not be repeated here. By this process an array of nanostructures 150 formed from the first material layer 110 are exposed. The array of nanostructures 150 being composed of the same or modified material as the first material 110. A width of the nanostructures 150 is typically in the range of 3-100 nm. A height of the nanostructures 150 is typically in the range 3-200 nm. The top surfaces of such formed nanostructures 150 are stepped due to the process of applying the stepped spacer structures 134. This is another type of patterning of the array of "resulting" nanostructures formed from the self-aligned multiple patterning process. That is, a stepped top surface of the array of "resulting" nanostructures may be formed.

Figure 2:
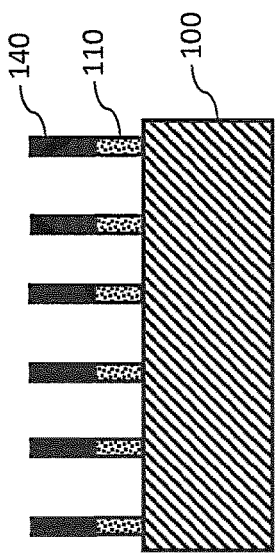
FIG. 2, comprising FIGS. 2A-2D, schematically illustrates process steps in a self-aligned multiple patterning process.
Figure 2:
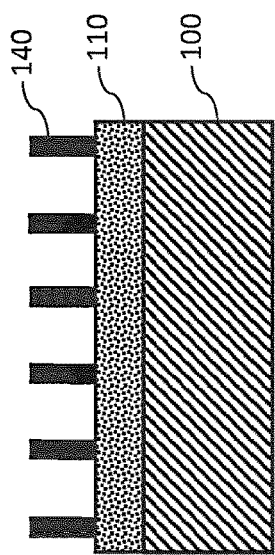
Figure 2:
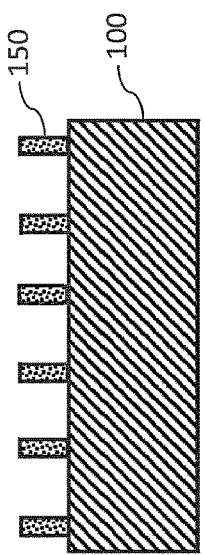
Figure 2:
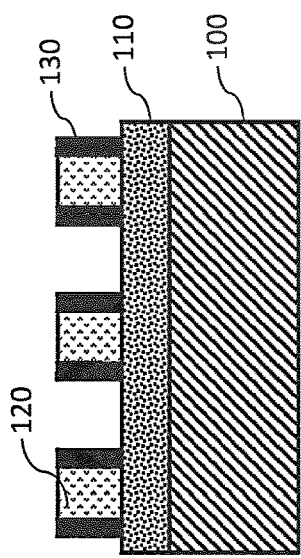
Figure 4:
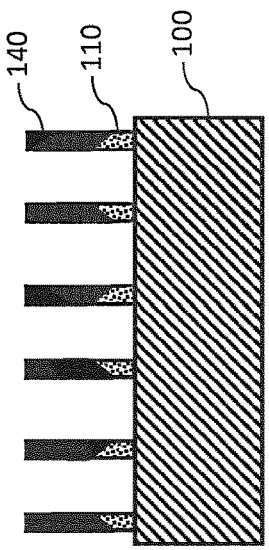
FIG. 4, comprising FIGS. 4A-4D, schematically illustrates process steps in a self-aligned multiple patterning process.
Figure 4:
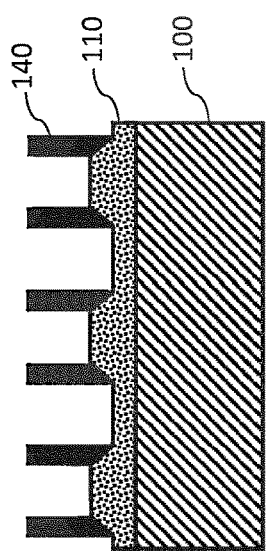
Figure 4:
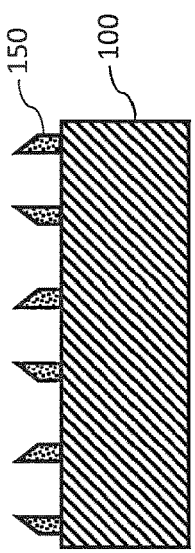
Figure 4:
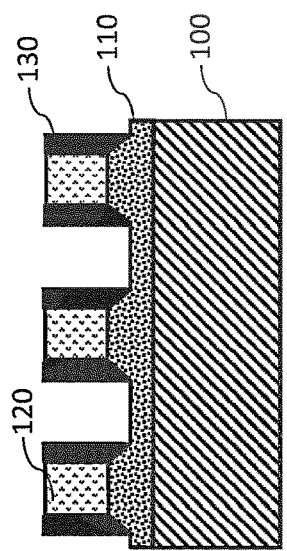
Figure 5:
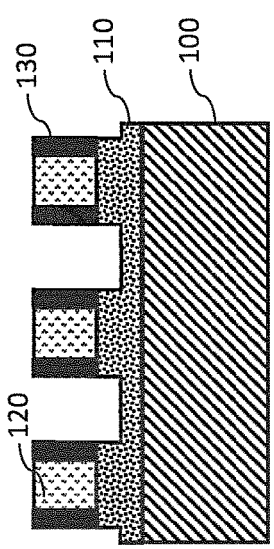
FIG. 5, comprising FIGS. 5A-5G, schematically illustrates yet an alternative process of formation of spacer structures on sidewalls of an array of nanostructures using a cyclic modification process.
Figure 5:
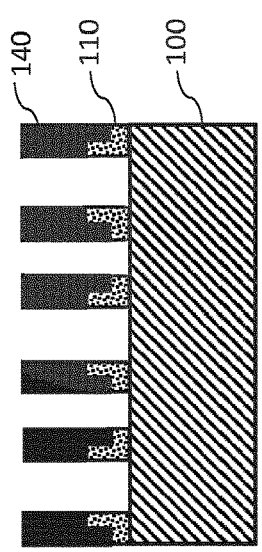
Figure 5:
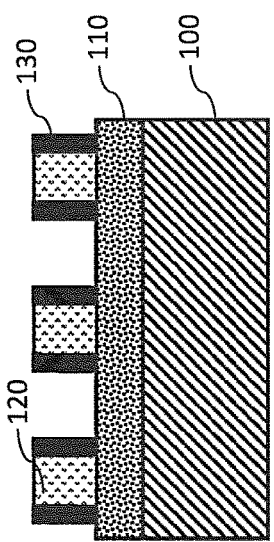
Figure 5:
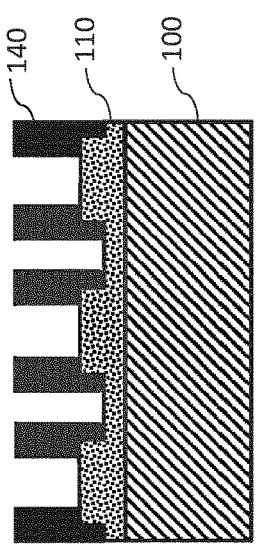
Figure 5:
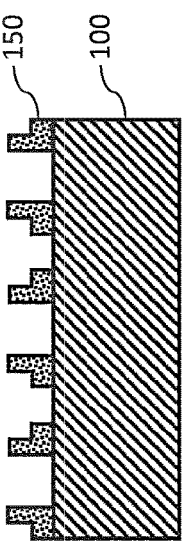
Figure 5:
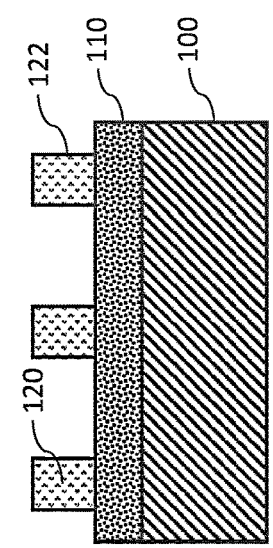
Figure 6:
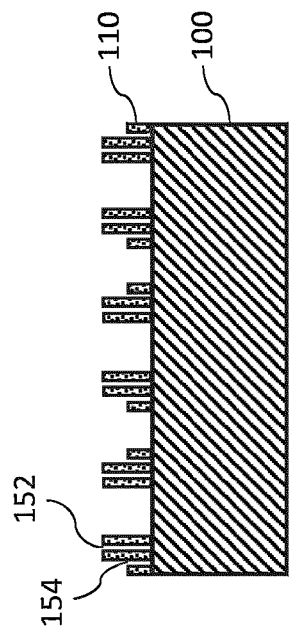
FIG. 6, comprising FIGS. 6A and 6B, schematically illustrates etching of recesses in nanostructures formed using the process disclosed in this disclosure.
Figure 6:
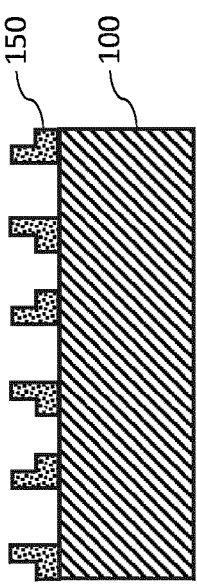

The array of nanostructures 150 formed in accordance with any of the processes discussed above, i.e. the array of nanostructures 150 formed in accordance with the discussion of any one of FIG. 2, 4 or 5, may be further split into a more fine graded array of nanostructures. This will be discussed in more detail in connection with FIGS. 6A and 6B in which the array of nanostructures 150 formed as discussed in connection with FIG. 5 will be used as an example. In order to further shape the nanostructures 150 in the array of nanostructures 150 they can be subjected to a cyclic etch process. Each cycle in such a cyclic etch process comprises i) subjecting the array of nanostructures 150 to surface modification and thereafter ii) subjecting the array of nanostructures to a particle beam. Wherein the surface modification comprises one or more of chemisorption, deposition, conversion and extraction. Wherein the particle beam consists of particles having an energy of less than 1000 eV, preferably less than 400 eV, more preferably less than 150 eV, even more preferably less than 100 eV. Wherein the particle beam has a direction being parallel with a surface normal to the layer structure within a deviation of ±20°, preferably within a deviation of ±10°. A particle beam having such low energies and such a direction in relation to the main surface provides a selective etching process forming a recess in the exposed nanostructure starting at the main surface thereof. Such a cyclic etch process etching recesses in nanostructures is discussed in more detail in WO2017157902. Hence, by the cyclic etch process selective etching of main surfaces of the array of nanostructures 150 relative to walls of the array of nanostructures 150 is achieved such that one or more recesses 152, 154 are formed in each of the nanostructures 150 in the array of nanostructures 150. In the example of the nanostructures 150 illustrated in connection with FIG. 6 two recesses will be formed in each nanostructure 150. This is since each nanostructure 150 is stepped and comprises two different main surfaces.

All process steps in the self-aligned multiple patterning processes discussed above can be made in the same processing chamber. Further, already established semiconductor fabrication plants may be used for performing the processes discussed above.

The person skilled in the art realizes that the present invention by no means is limited to what is explicitly described above. On the contrary, many modifications and variations are possible within the scope of the appended claims.

For example, the top surfaces of nanostructures formed by the patterning of the array of "resulting" nanostructures discussed above may take different shapes by combining the processes discussed in connection with FIGS. 3A-3G and FIGS. 5A-5D. Hence, mixing of inclinations and steps may be formed. Some examples of such forms are schematically illustrated in FIGS. 7A and 7B.

Additionally, variations can be understood and effected by the skilled person in practicing the claimed invention, from a study of the drawings, the disclosure, and the appended claims.

What is claimed is:

1. A method for forming an array of nanostructures, the method comprising the following steps:
providing a layer structure including an array of first sacrificial nanostructures arranged on a supporting layer structure comprising at least a first material layer and a substrate;
selectively applying spacer structures on sidewalls of the array of first sacrificial nanostructures;
selectively etching away the array of first sacrificial nanostructures such that the spacer structures form an array of second sacrificial nanostructures;

etching the first material layer using the array of second sacrificial nanostructures as an etching mask; and removing the array of second sacrificial nanostructures thereby exposing an array of nanostructures formed from the first material layer, wherein selectively applying spacer structures on the sidewalls of the array of first sacrificial nanostructures comprises a cyclic modification process where each cycle comprises:

isotropic modification of exposed surfaces of the array of first sacrificial nanostructures and of the first material layer, and anisotropic etching of modified material from top surfaces of the first material layer and the first sacrificial nanostructures, thereby gradually forming the spacer structures on the sidewalls of the array of first sacrificial nanostructures.

2. The method according to claim 1, wherein the isotropic modification comprises one or more of deposition, adsorption, conversion and extraction.

3. The method according to claim 1, wherein the anisotropic etching comprises dry etching.

4. The method according to claim 1, wherein in each cycle of the cyclic modification process the anisotropic etching follows directly after the isotropic surface modification.

5. The method according to claim 1, wherein one or more of the cycles of the cyclic modification process further comprises an intermediate step for removal of remaining gases and byproducts, such as pump step, a purge step or their combination.

6. The method according to claim 1, further comprising, during the cyclic modification process, anisotropic etching away material from top surfaces of the first material layer thereby forming an inclination in surfaces forming borders between the spacer structures and the first material layer.

7. The method according to claim 1, further comprising, in between selectively applying spacer structures on the sidewalls of the array of first sacrificial nanostructures and selectively etching away the array of first sacrificial nanostructures:

etching away a sublayer of the first material layer using the first sacrificial nanostructures and the spacer structures on the sidewalls of the first material layer as an etching mask; and selectively applying additional spacer structures on sidewalls of the spacer structures and on the sidewalls of the first material layer exposed by the etching away the sublayer of the first material layer.

8. The method according to claim 7, wherein selectively applying the additional spacer structures is made by a cyclic modification process where each cycle comprises:

isotropic modification of exposed surfaces of the array of first sacrificial nanostructures and of the first material layer, and anisotropic etching of modified material from top surfaces of the first material layer and the first sacrificial nanostructures, thereby gradually forming the additional spacer structures on sidewalls of the spacer structures.

9. The method according to claim 1, further comprising subjecting the array of nanostructures formed from the first material layer to a cyclic etch process where each cycle comprises subjecting the array of nanostructures to surface modification by one or more of chemisorption, deposition, conversion and extraction and subjecting the array of nanostructures to a particle beam consisting of particles having an energy of less than 1 keV, wherein the particle beam having a direction being parallel with a surface normal to the substrate within a deviation of ±20°, whereby selective etching of main surfaces of the array of nanostructures relative to walls of the array of nanostructures is achieved such that a recess is formed in each of the nanostructures in the array of nanostructures.

10. The method according to claim 1, wherein all the steps are performed in a same processing chamber.

* * * * *